(12) United States Patent
Gao (10) Patent No.: US 11,849,567 B2
(45) Date of Patent: Dec. 19, 2023

(54) SERVER CONFIGURATION WITH HYBRID ENVIRONMENT DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 140 days.

(21) Appl. No.: 17/399,266

(22) Filed: Aug. 11, 2021

(65) Prior Publication Data
US 2023/0049108 A1 Feb. 16, 2023

(51) Int. Cl.
*H05K 7/20* (2006.01)
*H05K 7/14* (2006.01)

(52) U.S. Cl.
CPC ....... *H05K 7/20818* (2013.01); *H05K 7/1489* (2013.01)

(58) Field of Classification Search
CPC .............. H05K 7/203; H05K 7/20809; H05K 7/20818; H05K 7/20236; H05K 7/20327; H05K 7/20781; H05K 7/20272; H05K 7/208; H05K 7/20254; H05K 7/1487; H05K 7/20727; G06F 1/20; G06F 2200/201; H01L 23/473; H01L 23/44
USPC ..... 361/679.53, 700, 702, 679.46, 699, 698, 361/727, 724, 715, 725; 165/104.33, 165/80.4, 104.21; 257/714, 715
See application file for complete search history.

(56) References Cited

U.S. PATENT DOCUMENTS

| | | | | |
|---|---|---|---|---|
| 10,791,647 | B1 * | 9/2020 | Miyamura | H05K 7/1487 |
| 11,096,305 | B1 * | 8/2021 | Peng | H05K 7/1418 |
| 2008/0239649 | A1 * | 10/2008 | Bradicich | G06F 1/183 |
| | | | | 361/725 |
| 2009/0109609 | A1 * | 4/2009 | Lai | G06F 1/187 |
| | | | | 361/679.39 |
| 2014/0218858 | A1 * | 8/2014 | Shelnutt | H05K 7/203 |
| | | | | 361/679.31 |
| 2016/0240226 | A1 * | 8/2016 | Shelnutt | H05K 7/203 |
| 2017/0172011 | A1 * | 6/2017 | Chen | H05K 7/20636 |
| 2021/0102294 | A1 * | 4/2021 | Miljkovic | H01L 21/02271 |
| 2023/0025254 | A1 * | 1/2023 | Curtis | H05K 7/20272 |

* cited by examiner

*Primary Examiner* — Mandeep S Buttar
(74) *Attorney, Agent, or Firm* — WOMBLE BOND DICKINSON (US) LLP (57) ABSTRACT

According to one embodiment, a server chassis for immersion cooling includes a chassis frame having a chassis base and an adjustable server panel coupled to the chassis base to receive a server blade to be mounted on the adjustable server panel. The server blade includes a first portion and a second portion. The first portion has a first set of electronic components and the second portion has a second set of electronic components. The adjustable server panel is adjustably mounted along the chassis base, such that when the server chassis is deposited into a container having two-phase coolant therein, the first set of electronic components is at least partially submerged into a liquid region filled with the two-phase coolant, and the second set of electronic components is positioned within a vapor region above an immersion line defining the liquid region and the vapor region.

20 Claims, 8 Drawing Sheets

SERVER CONFIGURATION WITH HYBRID ENVIRONMENT DESIGN

FIELD

Embodiments of the present disclosure relate generally to a server configuration with hybrid environment design for immersion cooled information technology (IT) equipment.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. There are many existing air cooling solutions for data centers with a primary function to supply cooling air to a room, remove hot air from the room, and process the hot air back to the cooling air.

Recently, data centers have been deploying more high-power density electronic racks, where more high-density chips are packaged closer together to provide more processing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges. For example, a data center's cooling infrastructure may need to be modified to be able to support operating an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center. As another example, conventional two-phase immersion cooling systems include a condenser that is packaged within an immersion container along with the submerged electronics (e.g., positioned above the electronics). When maintenance is performed (e.g., when a server needs to be replaced), a data center operator must remove the condenser from the container, thereby breaking the existing cooling loop. In order to prevent overheating due to the loss of the dielectric solution (e.g., coolant) while performing maintenance, the electronics within the container may need to shut down, which results in service interruption.

The existing two-phase immersion cooling system design lacks a design consideration for electronics reliability and fluid loss. For example, the existing system design lacks a design consideration that may prevent fluid loss or vapor escaping from the system during a maintenance of a server (e.g., changing a hard drive).

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problems described above by providing a hybrid design architecture for a server that can be implemented with both direct and indirect two-phase cooling hybrid in a two-phase immersion cooling system. When implemented, the hybrid design architecture enables an operator to perform maintenance upon the two-phase immersion cooling system without breaking the existing cooling loop. Specifically, the present disclosure describes a design architecture of a server that maintains a desired coolant and vapor level while the container is open, thereby allowing the IT equipment to be cooled continuously by the system to remain active.

The server design includes a server chassis having a portion with electronic packages and heat extracting loops configured to extract heat and transfer the heat to a remote cooler. The remote cooler is positioned in another portion of the server chassis that is going to be submerged within a two-phase fluid contained in an immersion container. The portion of the server chassis having the electronic packages and the heat extracting loops is designed to be above a surface of the two-phase fluid. The surface or level of the two-phase fluid is referred to as an immersion line that defines or divides a liquid region and a vapor region of the immersion container. The server chassis is designed with an adjustable server panel that can be adjusted to form a varying air region within the server chassis. In addition, the remote cooler and the heat extractor can be packaged on an add-on frame which can be later assembled to the server chassis.

According to one embodiment, a server chassis for immersion cooling includes a chassis frame having a chassis base and an adjustable server panel coupled to the chassis base to receive a server blade to be mounted on the adjustable server panel. The server blade includes a first portion and a second portion. The first portion has a first set of electronic components and the second portion has a second set of electronic components. The adjustable server panel is adjustably mounted along the chassis base, such that when the server chassis is deposited into a container having a two-phase coolant therein, the first set of electronic components is at least partially submerged into a liquid region filled with the two-phase coolant, and the second set of electronic components is positioned within a vapor region above an immersion line defining the liquid region and the vapor region.

In one embodiment, the adjustable server panel is adjusted along the base frame to adjust the immersion line.

In one embodiment, the server chassis further includes a heat extractor to be attached to at least one of the electronic components of the second set in the second portion of the server blade such that the heat extractor is positioned within the vapor region and above the immersion line when the server blade is positioned in an upright position within the container. The heat extractor is configured to extract heat from the second portion of the server blade. The server chassis additionally includes a remote cooler to be positioned in a predefined location in the first portion of the server blade such that the remote cooler is submerged within the two-phase coolant. The remote cooler is thermally coupled to the heat extractor to receive the heat from the heat extractor and extract the received heat into the two-phase coolant.

In another embodiment, the remote cooler is elevated from the chassis base of the chassis frame using an elevation frame, thereby providing an additional space for the server blade to mount additional electronic components.

In one embodiment, the elevation frame is coupled to the chassis base of the chassis frame and positioned near one of two sides of the chassis frame. The two sides of the chassis frame are perforated with openings to maximize a flow of the two-phase coolant through the openings. In one embodiment, the elevation frame is slidably coupled to a base frame. The base frame is to be positioned on a predefined location on the chassis base of the chassis frame. The predefined location on the chassis base of the chassis frame is adjustable.

In one embodiment, the heat extractor includes a fluid recirculating pump configured to draw heat from the heat extractor into the remote cooler. In one embodiment, the second set of electronic components includes one or more peripheral component interconnect express (PCIE) devices attached to one or more heat extractors. In one embodiment, the remote cooler is thermally coupled to the heat extractor via one or more copper plates, thereby allowing a heat transfer from the heat extractor to the remote cooler.

According to another embodiment, the above server chassis can be implemented in an immersion cooling system including a container having two-phase coolant contained therein and a plurality of server chassis for immersion cooling that is similar to the server chassis for immersion cooling as previously described. The container is partitioned into a plurality of server slots. The plurality of server chassis corresponds to the plurality of server slots. In particular, each of the e server chassis includes a chassis frame having a chassis base and an adjustable server panel coupled to the chassis base to receive a server blade to be mounted on the adjustable server panel. The server blade includes a first portion and a second portion. The first portion has a first set of electronic components and the second portion has a second set of electronic components. The adjustable server panel is adjustably mounted along the chassis base, such that when the server chassis is deposited into the container having the two-phase coolant therein, the first set of electronic components is at least partially submerged into a liquid region filled with the two-phase coolant, and the second set of electronic components is positioned within a vapor region above an immersion line defining the liquid region and the vapor region.

According to another embodiment, a data center system that includes a plurality of containers, each having two-phase coolant contained therein. Each of the containers is partitioned into a plurality of server slots to receive one of a plurality of server chassis. Each server chassis includes a server chassis for immersion cooling that is similar to the server chassis for immersion cooling as previously described. Specifically, each server chassis for immersion cooling includes a chassis frame having a chassis base and an adjustable server panel coupled to the chassis base to receive a server blade to be mounted on the adjustable server panel. The server blade includes a first portion and a second portion. The first portion has a first set of electronic components and the second portion having a second set of electronic components. The adjustable server panel is adjustably mounted along the chassis base, such that when the at least one server chassis is deposited into the container, the first set of electronic components is at least partially submerged into a liquid region filled with the two-phase coolant, and the second set of electronic components is positioned within a vapor region above an immersion line defining the liquid region and the vapor region.

A system, as discussed above, in accordance with embodiments may provide a high efficient server package, with a high density package and low signal loss on the board. The partition of the server blade can accommodate different types of electronic components. Consequently, an immersion cooling system in accordance with embodiments disclosed herein may accommodate different types of cooling solutions that can be integrated in a single chassis. The embodiments described herein may minimize the loss of two-phase coolant used in the immersion cooling system. In addition, the current design described herein may enable non-immersion electronics and immersion cooling electronics to be packaged together on the same board and to coexist in a server.

Further, the immersion cooling system may be of high reliability by preventing the loss of two-phase coolant even when containers in which the two-phase coolant is disposed are unsealed. The immersion cooling system may (a) provide an efficient packaging, (b) allow ease of service and operation, (c) accommodate the current model of the server chassis, (d) be of high flexibility with respect to the types of devices, size of devices, and configurations of devices that will be thermally managed by the system and/or may provide other benefits.

Figure 1:
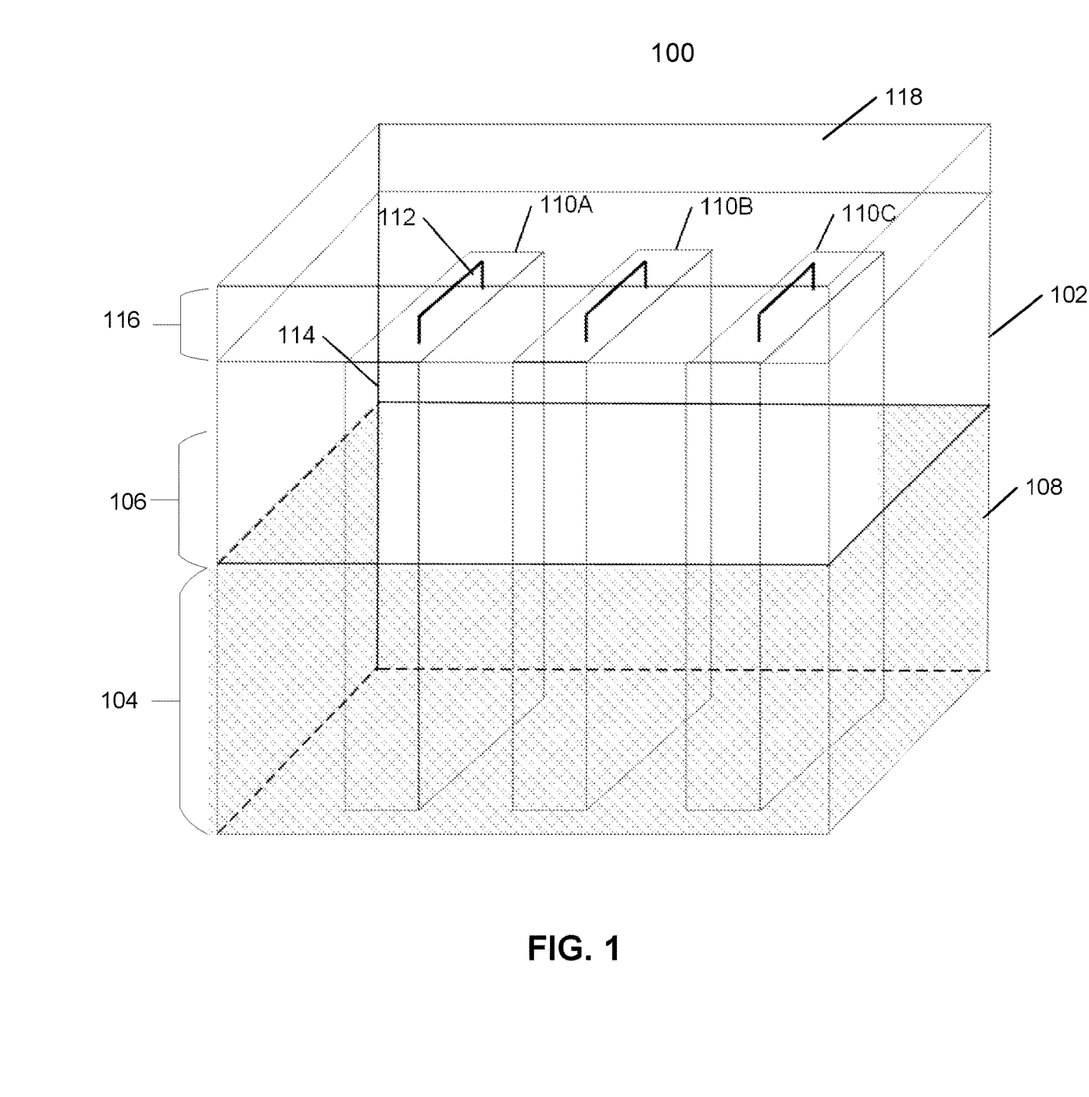
FIG. 1 is a block diagram illustrating an example of an IT equipment cooling system according to one embodiment.

FIG. 1 is a block diagram illustrating an example of an IT equipment cooling system 100 in which a server chassis for immersion cooling can be implemented in. Specifically, FIG. 1 shows an IT equipment cooling system 100 (which hereafter may be referred to as cooling system) that is configured to immersion cool a plurality of computing devices. The cooling system 100 can include a container 102 having at least three regions. The container 102 can be an immersion container. In one embodiment, the container 102 may be a sealed container and formed from one type of material (e.g., an alloy, etc.). The at least three regions within the container 102 can include a liquid region 104, a vapor region 106, and air region 116. The liquid region 104 has a cooling liquid, such as two-phase coolant 108, contained therein.

As illustrated in FIG. 1, the system 100 can further include a plurality of computing devices, such as one or more server blades 110A-110C that can be at least partially submerged in the two-phase coolant 108 inside the container 102. The plurality of computing devices disposed in container 102 may include any type and quantity of devices. The plurality of computing devices may include computing devices that are part of a data center. The one or more server blades 110A-110C may include a printed circuit board (PCB) with electronic components mounted on them, such as processors, memory, storage devices, etc. The one or more server blades 110A-110C may be contained in a chassis frame 202 (not shown) having a handle 112 to facilitate an easy installation into the container 102. The chassis frame 202 will be described in detail below in conjunction with FIG. 2. The handle 112 also allows the one or more server blades 110A-110C to be easily pulled out for maintenance.

The one or more server blades 110A-110C may also be installed within the chassis frame 202 (annotated in FIG. 2) providing a support system configured to support and contain the one or more server blades 110A-110C. In addition, a top of the one or more server blades 110A-110C may not be higher than a top of the container 102 when the one or more server blades 110A-110C are installed in an upright or vertical position within the container 102. In one embodiment, the container 102 may include a lid 118 positioned at the top of the container 102. In this embodiment, the one or more server blades 110A-110C may be fully contained within the container 102.

The server blade (e.g., 110A) within the chassis frame 202 (annotated in FIG. 2) can be submerged into the container 102. A portion of the container 102 may be filled with an engineered fluid, e.g., two-phase coolant 108. This portion of the container 102 may form a liquid region 104 and provide a fluid bath. Two-phase liquid immersion cooling process allows heat to transfer by evaporation and condensation. Two-phase liquid immersion cooling process can be implemented by the cooling system 100 described herein. The two-phase coolant 108 that comes into contact with the server blade 110A having electronic components (e.g., central processing unit (CPU) Application-Specific Integrated Circuit (ASIC), or graphics processing unit (GPU)), may boil the two-phase coolant 108 and the heat may evaporate into a vapor.

Figure 2:
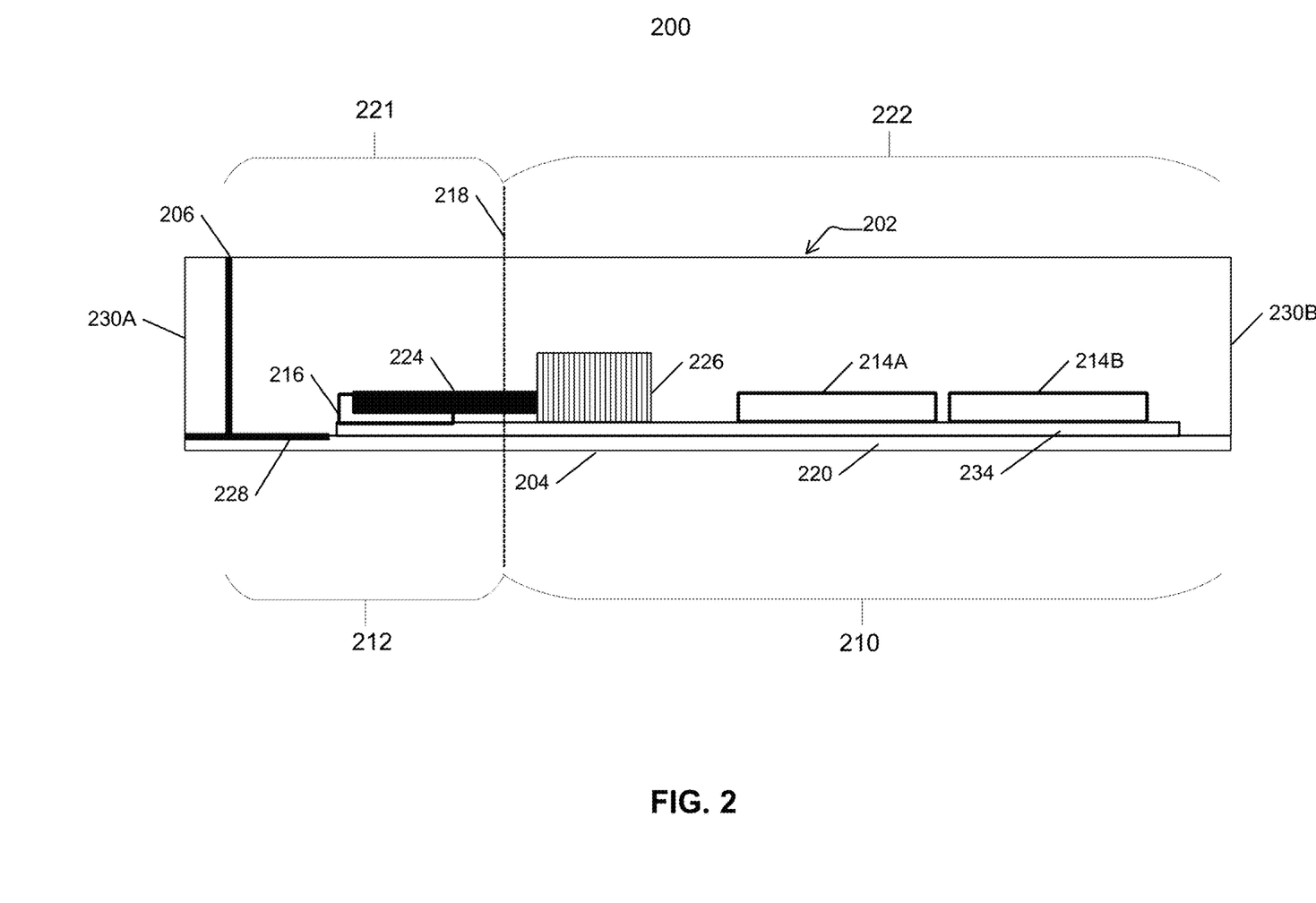
FIG. 2 is a block diagram illustrating an example of a server chassis for immersion cooling according to one embodiment.

A cooling condenser coil (not shown) may be coupled to the chassis frame 202 (annotated in FIG. 2). The vapor will then condense on the cooling condenser coil and the vapor rains back to the fluid bath represented by the liquid region 104. Through this process of evaporation and condensation, the heat from the electronic components of the server blade is dissipated. Through the two-phase liquid immersion cooling process implemented by the cooling system 100 described above, the server blade 110A having electronics components (e.g., CPU or GPU) can operate at temperatures a lot higher than the normal air cooling. The cooling system 100 allows the server blade 110A to run at greater speeds to achieve higher performance while reducing power and energy consumption. In addition, the server blade 110A can be packaged a lot closer and a lot more server blade 110A can be installed within the same space (e.g., a data center) ensuring a high density server blade within the cooling system 100 in a data center. Through this two-phase liquid immersion cooling process, computing power densities can be multiplied while physical size can be reduced, and the operating thermal environment can be maintained.

As illustrated in FIG. 1, the container 102 is configured to hold one or more server blades 110A-110C and two-phase coolant 108. As shown, inside the container 102 are several (e.g., three) pieces of server blades 110A-110C that are at least partially submerged in a two-phase coolant 108. As described herein, the container 102 includes one or more pieces of server blades 110A-110C. Thus, the container 102 may be sized differently in order to accommodate more (or less) pieces of server blades. While illustrated in FIG. 1 as included a limited number of specific components, a system in accordance with one or more embodiments may include fewer, additional, and/or different components.

FIG. 2 is a block diagram illustrating an example of a server chassis 200 for immersion cooling according to one embodiment. The server chassis 200 can be implemented in the cooling system 100 described herein. The server chassis 200 for immersion cooling includes a chassis frame 202 having a chassis base 204 and an adjustable server panel 206 coupled to the chassis base 204 to receive a server blade 220 to be mounted on the adjustable server panel 206. The chassis frame 202 may receive a server blade 220 of any size. When mounted on the adjustable server panel 206, a portion of the server blade 220 can be submerged into the container 102 (see FIG. 1) for immersion cooling. The server blade 220 may be installed in an upright or vertical position within the container 102 (see FIG. 1) having the two-phase coolant 108 therein. The server blade 220 may also be removed from the container 102 (see FIG. 1) for maintenance. The chassis frame 202 may have chassis sides 230A-230B. The handle 112 may be coupled to the chassis side 230A, for example, for easy handling of the server blade during installation or maintenance. The chassis side 230B, for example, may contact with the bottom of the container 102 (see FIG. 1) when the server blade 220 is installed in the system 100. In this embodiment, for example, the adjustable server panel 206 may be positioned in the middle of the vapor region 106 in FIG. 1. The chassis side 230A may be positioned below the lid of the container 102 (see FIG. 1) when the server blade is installed in the system 100.

The server blade 220 includes a first portion 210 and a second portion 212. The server blade 220 may include a printed circuit board (PCB) 234 with electronic components (e.g., 214A-214B, 216) mounted on them. The first portion 210 may have a first set of electronic components 214A-214B and the second portion 212 may have a second set of electronic components 216. The first and the second set of electronic components 214A-214B, 216 may include any number and type of electronic components that generate heat during operation including, but not limited to, integrated chips (ICs), processors (e.g., CPU or GPU), memory modules, storage devices, and communication devices.

The adjustable server panel 206 is adjustably mounted along the chassis base 204, such that when the server chassis 202 is deposited into container 102 (see FIG. 1) having two-phase coolant 108 (see FIG. 1) therein, the first set of electronic 214A-214B components is at least partially submerged into a liquid region 104 (see FIG. 1) filled with the two-phase coolant 108 (see FIG. 1), and the second set of electronic components 216 is positioned within a vapor region 106 (see FIG. 1) above an immersion line 218 defining the liquid region 104 (see FIG. 1) and the vapor region 106 (see FIG. 1). The second set of electronic components 216 is positioned within the vapor region 106 which is between the air region 116 the liquid region 104 (see FIG. 1).

The adjustable server panel 206 may be used to form a contained region once the server blade 220 is populated in the container 102 (see FIG. 1). As illustrated, the adjustable server panel 206 can be adjusted along a base frame 228 which is coupled to the chassis base 204. That is, the region 221 between the adjustable server panel 206 and the immersion line 218 can be adjusted, thereby accommodating different immersion environment, server configuration, and operation requirement.

As shown, the server chassis is designed to be operated in two cooling environments (or a hybrid environment) separated by the immersion line 218. The region 221 (shown on the left hand side of the immersion line 218) represents an indirect immersion cooling environment in which the electronic components (e.g., the second set of electronic components 216) is positioned to be within the vapor region 106. That is, the second set of electronic components 216 is selected to be in the indirect immersion cooling environment. The region 221 can represent the vapor region 106 as described in FIG. 1. The region 222 (shown on the right hand side of the immersion line 218) represents a direct immersion cooling environment in which the electronic components (e.g., the first set of electronic components 214A-214B) are designed to be completely submerged in the direct immersion cooling environment. That is, the first set of electronic components 214A-214B is selected to be in the direct immersion cooling environment. The region 222 can represent the liquid region 104 as described above. The first set of electronic components is directly cooled by the two-phase coolant and the second set of electronic components is indirectly cooled by the two-phase coolant. The indirect immersion cooling environment and the direct immersion cooling environment form a hybrid environment.

In one embodiment, the server chassis 202 further includes a heat extractor 224 and a remote cooler 226. The heat extractor 224 is to be attached to at least one of the electronic components of the second set in the second portion 212 of the server blade such that the heat extractor 224 is positioned within the vapor region 106 and above the immersion line 218 when the server blade is installed in an upright position within the container 102 (see FIG. 1). The heat extractor can be configured to extract heat from the second portion 212 of the server blade 220. The second portion 212 of the server blade 220 may be positioned within the vapor region 106.

The remote cooler 226 is to be positioned in a predefined location in the first portion 210 of the server blade 220 such that the remote cooler 226 is at least completely submerged within the two-phase coolant 108. The remote cooler 226 is thermally coupled to the heat extractor 224. The remote cooler 226 is configured to receive the extracted heat from the heat extractor 224 and extract the received heat into the two-phase coolant 108. The second set of electronic components 216 may be coupled to the heat extractor 224 positioned near a top of the second set of electronic components 216. The heat extractor 224 may be configured to be thermally connected to the remote cooler 226. Remote cooler 226 may be implemented using any type of device that performs any cooling method without departing from embodiments disclosed here. Remote cooler 226 may condense two-phase coolant vapor by transferring the heat from two-phase coolant vapor into two-phase coolant 108. Therefore, the heat transferred into two-phase coolant 108 are transferred from the vapor region 221 into the liquid region 222, thereby thermally managing the electronic components within the server blade 220 submerged in two-phase coolant 108 contained in container 102 (see FIG. 1).

In one embodiment, the adjustable server panel 206 is adjusted along the base frame 228 to adjust the immersion line 218. The adjusted immersion line may adjust the vapor region 221 so the heat extractor is positioned within the vapor region 221 and not submerged within the liquid region 222. In some embodiments, adjusting the adjustable server panel 206 may cause the chassis side 230A (i.e., a top of the server blade) to be higher than the lid of the container when the server blade is installed in an upright position and when the lid of the container is open. However, embodiments described herein may require the server blade to be positioned within the container with the lid of the container closed.

Figure 3:
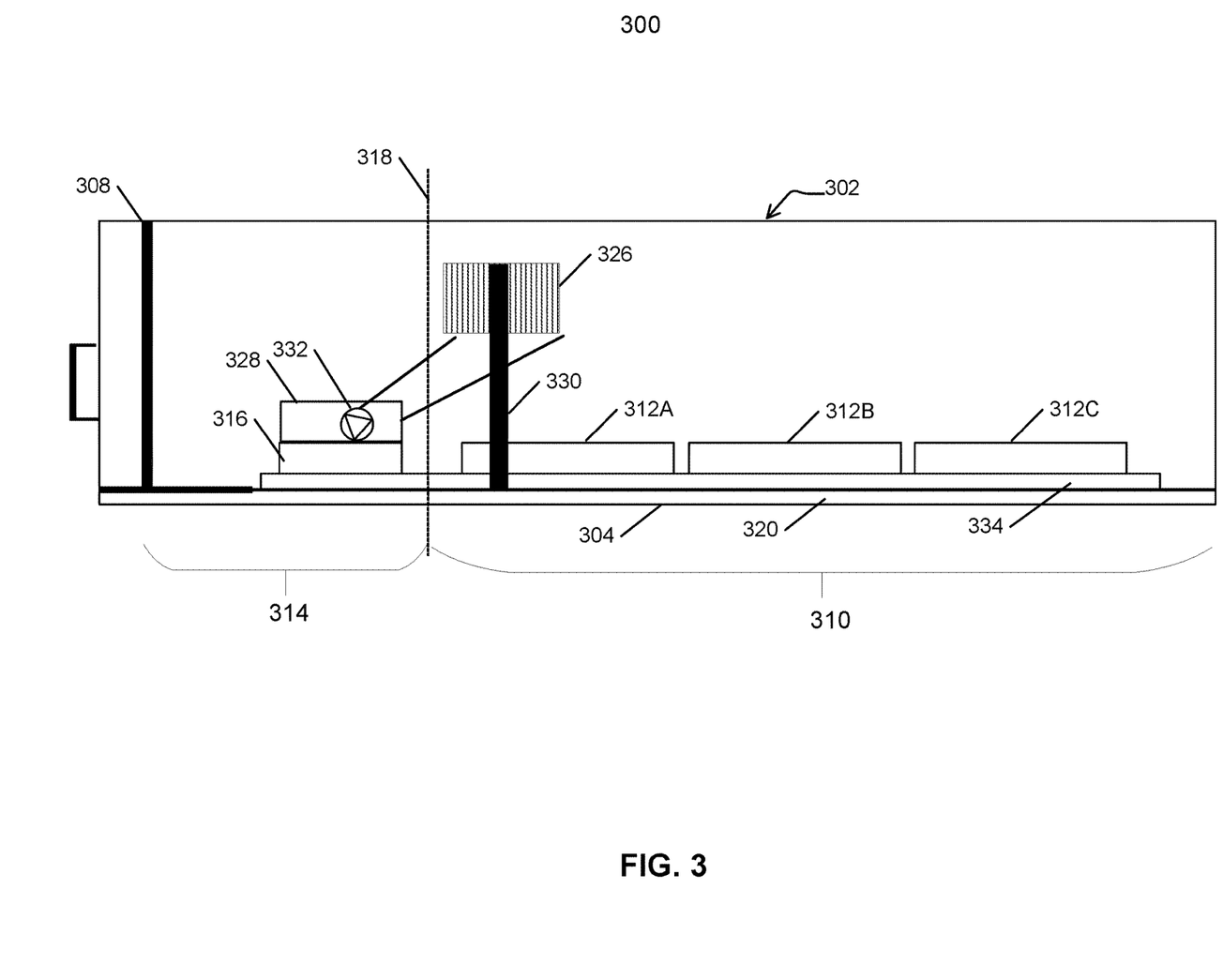
FIG. 3 is a block diagram illustrating another example of a server chassis for immersion cooling according to one embodiment.

Turning to FIG. 3, FIG. 3 is a block diagram illustrating another example of a server chassis 300 for immersion cooling according to one embodiment. In one embodiment, the remote cooler 326 is elevated from the chassis base 304 of the chassis frame 302 using an elevation frame 330, thereby providing additional space for the server blade 320 to mount additional electronic components. The server blade 320 may include a first portion 310 and a second portion 314. The remote cooler 326 and the elevation frame 330 are positioned within the first portion 310 of the server blade 320 and to the right hand side of the immersion line 318. Therefore, the remote cooler 326 and the elevation frame 330 are positioned within the liquid region 104. That is, a PCB 334 baseboard space can be efficiently used for packaging electronic components especially for the high density packages. It can be shown that with the elevated remote cooler 326 supported by the elevation frame 330, the PCB 334 baseboard space on the server blade 320 can be used for packaging higher density electronic components (e.g., 312A-312C).

As seen in FIG. 3, the elevation frame 330 is coupled to the chassis base 304 of the chassis frame 302 to elevate the remote cooler 326. The elevation frame 330 may be configured to be compatible with a different type of a remote cooler 326, a heat extractor 328, a second set of electronic components 316, and a server blade 320.

In one embodiment, the heat extractor 328 includes a fluid recirculating pump 332 configured to draw heat from the heat extractor 328 into the remote cooler 326. The fluid recirculating pump 332 is configured to draw heat from the heat extractor 328 into the remote cooler 326 because the remote cooler 326 position is lower than the heat extractor 328 when the server blade is installed in an upright position within the container 102 (see FIG. 1). As will be understood by those skilled in the art, the fluid recirculating pump 332 may also include other fluid-moving devices, that can move fluid from the heat extractor 328 into the remote cooler 326. The fluid recirculating pump 332 may be powered by electrical source, such as a power supply (not shown) that can be a part of the cooling system 100.

Figure 4:
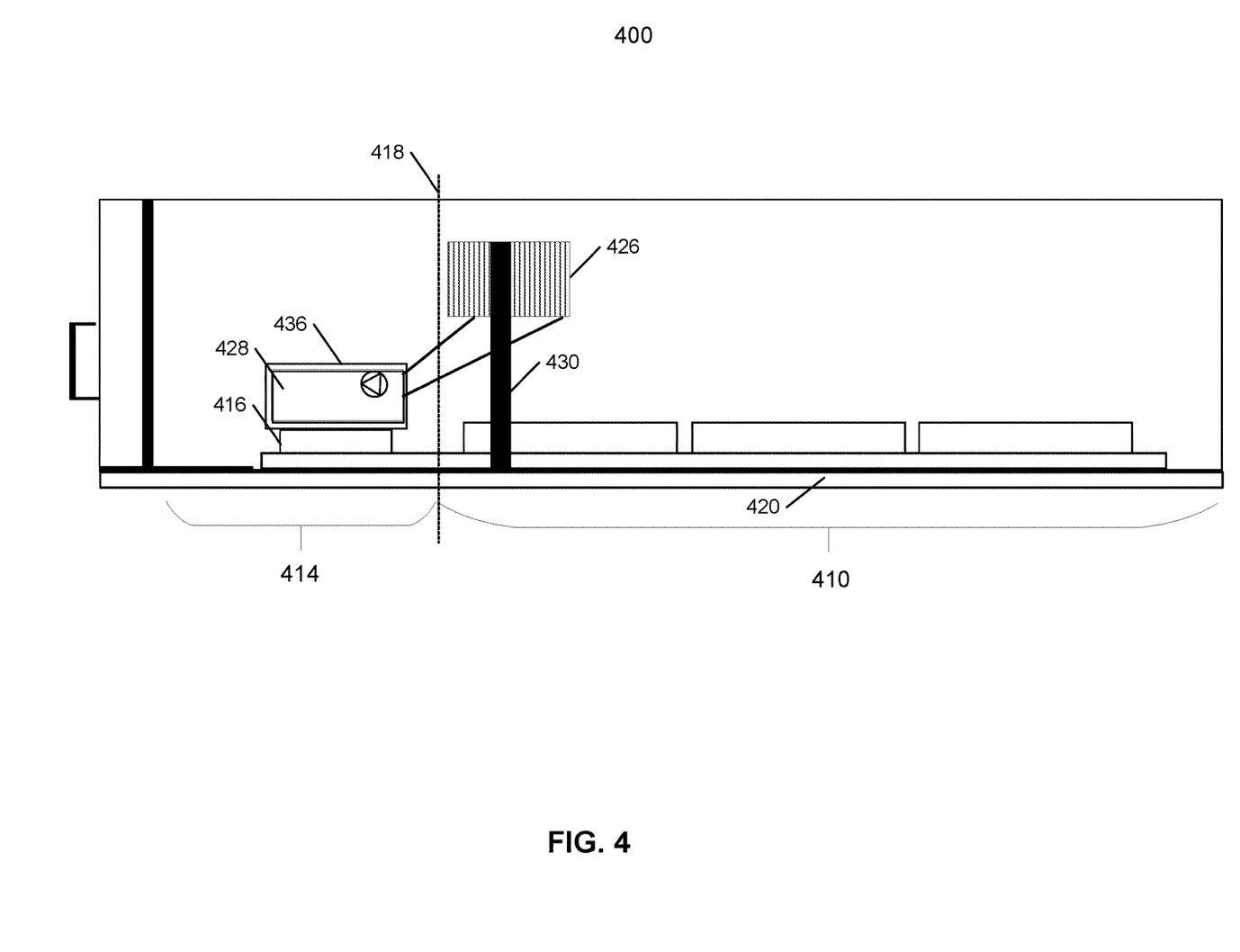
FIG. 4 is a block diagram illustrating another example of a server chassis for immersion cooling according to one embodiment.

FIG. 4 is a block diagram illustrating an example of a server chassis 400 for immersion cooling according to one embodiment. The server blade 420 may include one or more peripheral component interconnect express (PCIE) devices 436 within the second portion 414 of the server blade 420. In one embodiment, the second set of electronic components may include one or more peripheral component interconnect express (PCIE) devices 436 attached to one or more heat extractors 428. The heat extractor 428 may be thermally coupled to the remote cooler 426 elevated by an elevation frame 430 position within the first portion 410 of the server blade 420. The one or more PCIE devices 436 are positioned above the second set of electronic components 416 within the second portion 414 of the server blade 420. The one or more PCIE devices 436 may not be fully functional when positioned within the first portion 410 of the server blade 420. That is, the one or more PCIE devices 436 may not be suitable to be positioned within a direct immersion environment (e.g., liquid region) because of the compatibility, reliability, PCIE interface signal integrity issues, etc. Therefore, the server chassis design for immersion cooling enables the one or more PCIE devices 436 to be positioned within in the indirect immersion environment (e.g., vapor region), thereby minimizing compatibility, reliability, and PCIE interface signal integrity issues. The one or more PCIE devices 436 positioned within the indirect immersion environment can be serviced easily. In another embodiment, the heat extractor may be used with other type of integrated circuits (ICs) which are not designed to be submerged in the two-phase coolant.

Figure 5:
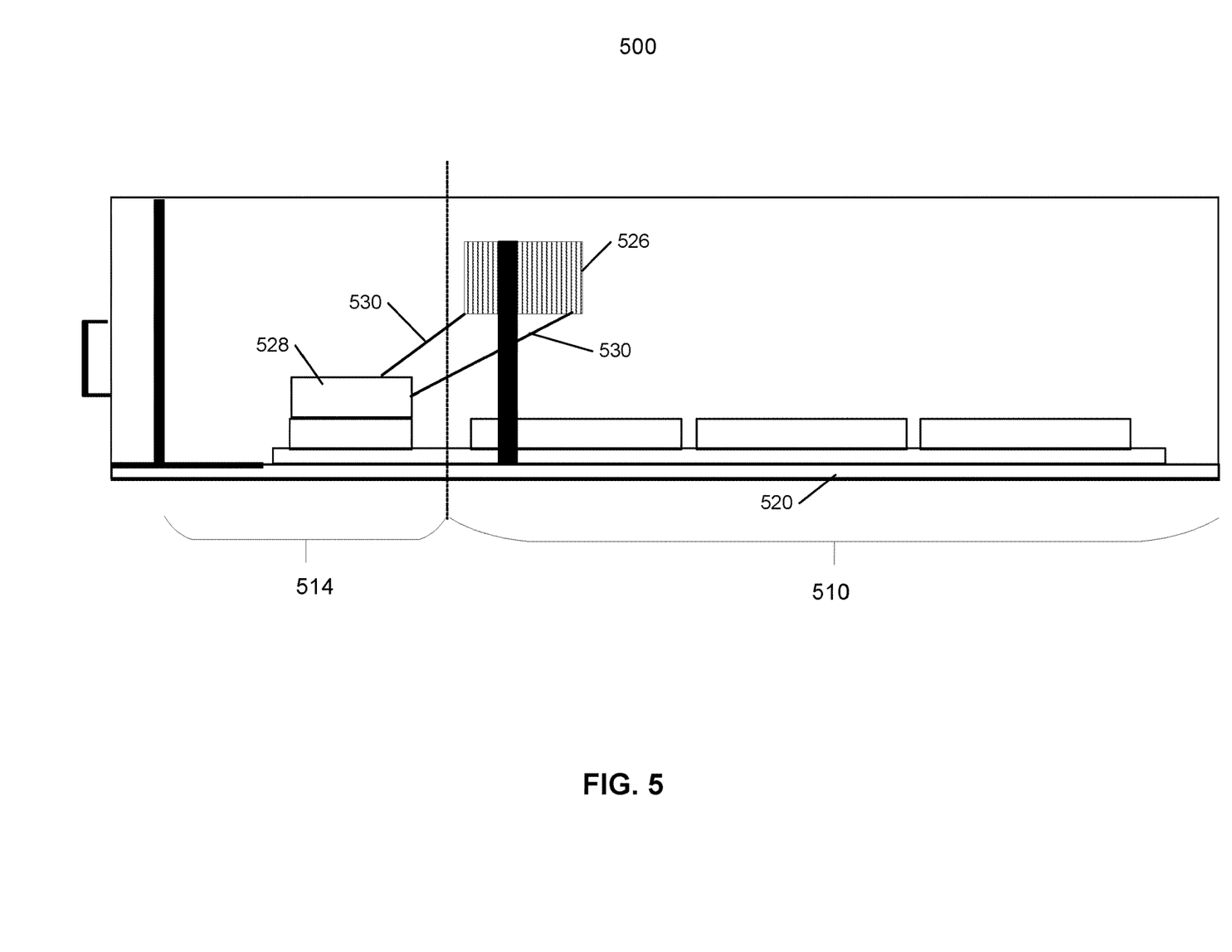
FIG. 5 is a block diagram illustrating another example of a server chassis for immersion cooling according to one embodiment.

FIG. 5 is a block diagram illustrating another example of a server chassis 500 for immersion cooling according to one embodiment. In one embodiment, the remote cooler 526 is thermally coupled to the heat extractor 528 via one or more copper plates 530, thereby allowing a heat transfer from the heat extractor 528 to the remote cooler 526. In one embodiment, the one or more copper plates 530 may be other type of heat transfer plates. The remote cooler 526 may be positioned within the first region 510 of the server blade 520 and the heat extractor 528 may be positioned within the second region 514 of the server blade 520. One or more copper plates 530 connecting the remote cooler 526 and the heat extractor 528 may provide a heat transfer mechanism.

Figure 6:
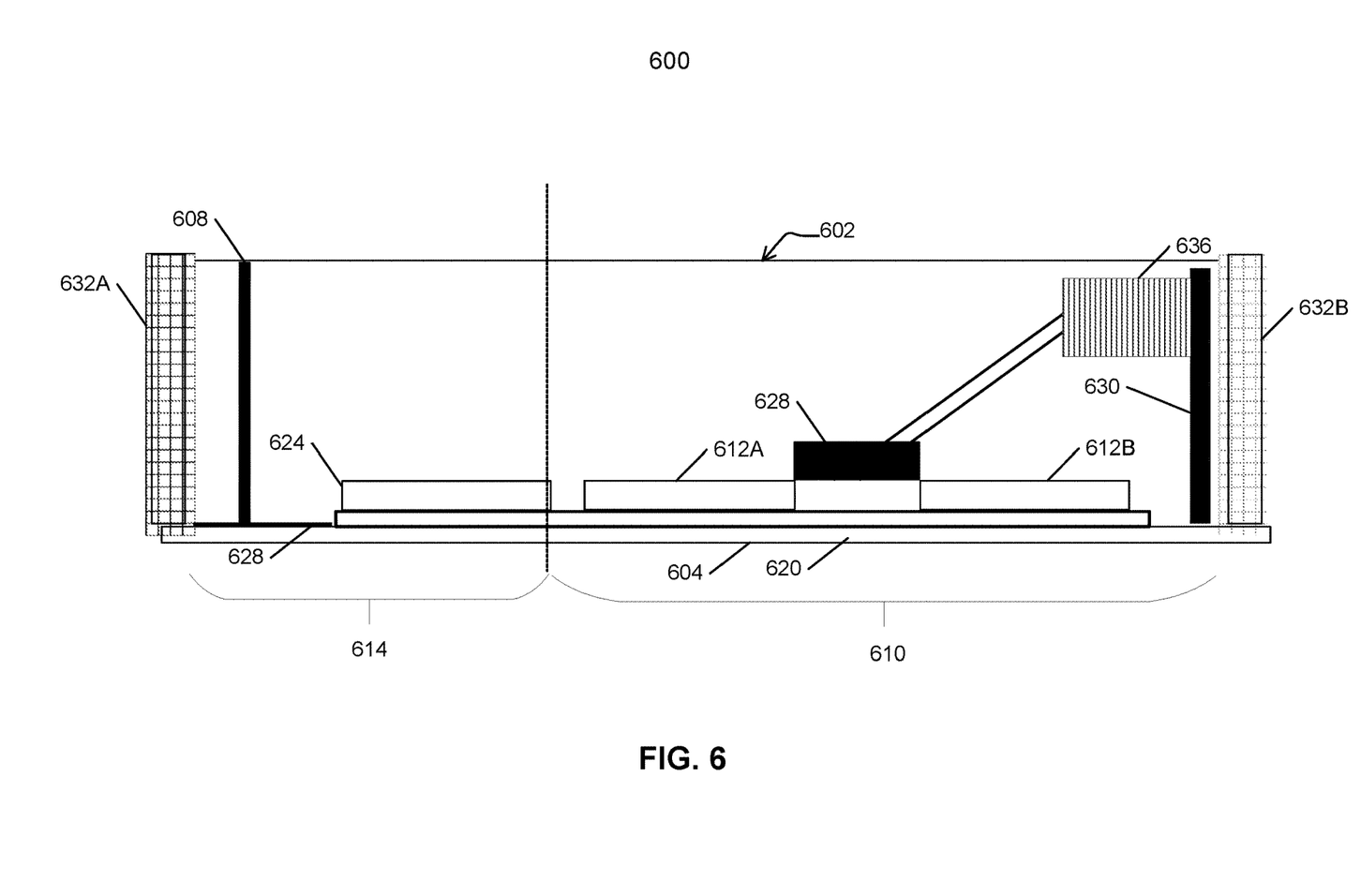
FIG. 6 is a block diagram illustrating another example of a server chassis for immersion cooling according to one embodiment.

FIG. 6 is a block diagram illustrating another example of a server chassis 600 for immersion cooling according to one embodiment. In one embodiment, the elevation frame 630 is coupled to the chassis base 604 of the chassis frame 602 and positioned near one of two sides 632A, 632B of the chassis frame 602. In this embodiment, the elevation frame 630 is positioned within the first portion 610 of the server blade 620. The elevation frame 630 is configured to elevate the remote cooler 636 thermally coupled to the heat extractor 638. The heat extractor 638 may be positioned between the first set of electronic components 612A-612B. The two sides 632A-632B of the chassis frame are perforated with openings to maximize a flow of the two-phase coolant through the openings.

As shown, the elevation frame 630 can be positioned at one end of the PCB board and near one of two sides 632B of the chassis frame 602. The adjustable server panel 608 is configured to cover the one of two sides 632A of the chassis frame 602. The adjustable server panel 608 is coupled to the base frame 628 disposed on the chassis base 608. The base frame 628 enables the adjustable server panel 608 to be adjusted based on an actual operation scenario and the corresponding configuration requirements.

Figure 7:
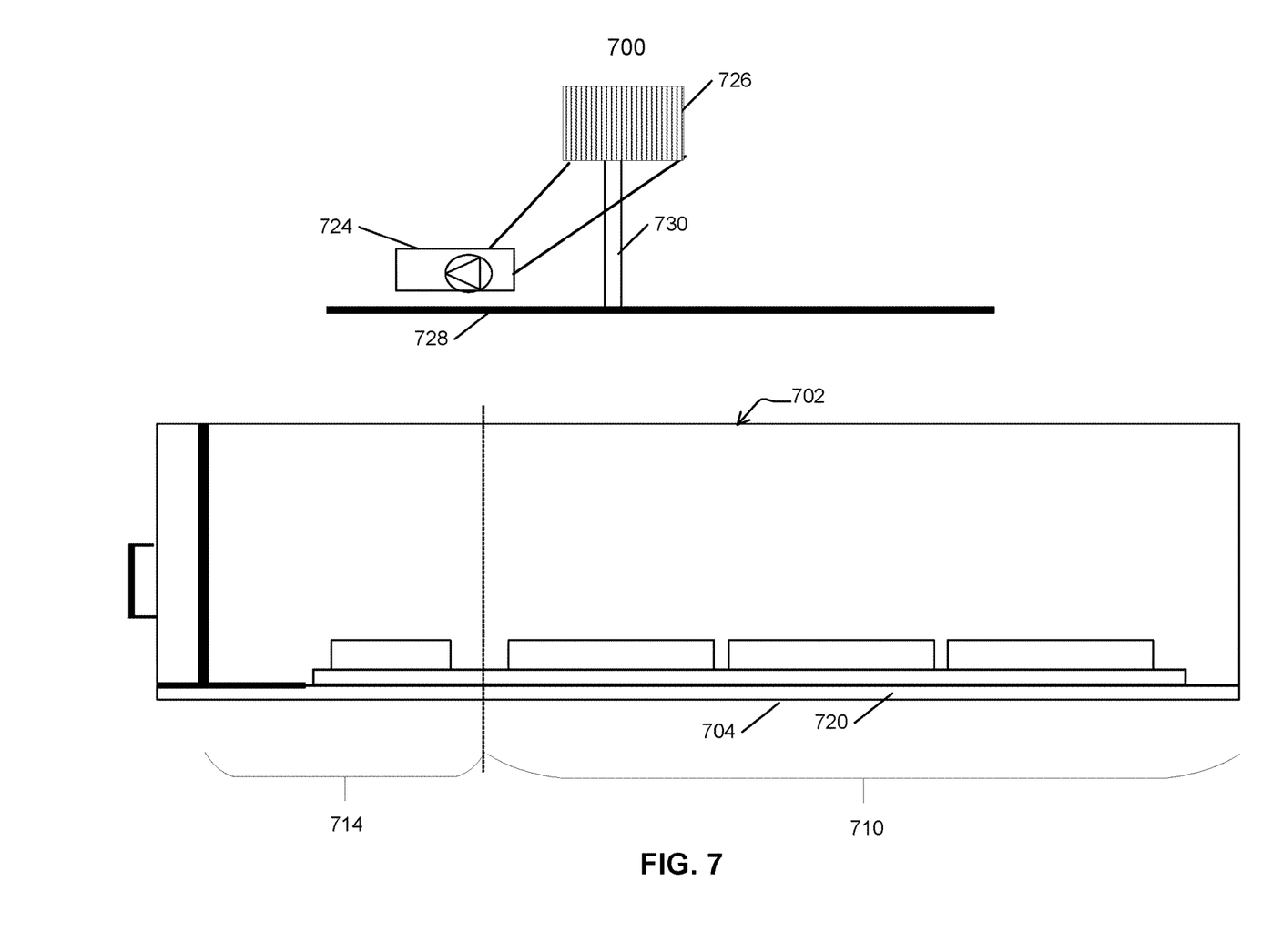
FIG. 7 is a block diagram illustrating an example of an elevation frame set that can be integrated with the server chassis for immersion cooling according to one embodiment.

FIG. 7 is a block diagram illustrating an example of an elevation frame set 700 that can be integrated with the server chassis design for immersion cooling according to one embodiment. The elevation frame set 700 may include a remote cooler 726, a heat extractor 724 and the connections. The frame set 700 is to be attached to the chassis frame 702 having a chassis base 704. The server blade 720 includes a first portion 710 and a second portion 714.

In one embodiment, the elevation frame 730 is slidably coupled to a base frame 728. The base frame 728 is to be positioned on a predefined location on the chassis base 704 of the chassis frame 702. The predefined location on the chassis base 704 of the chassis frame 702 is adjustable.

Figure 8:
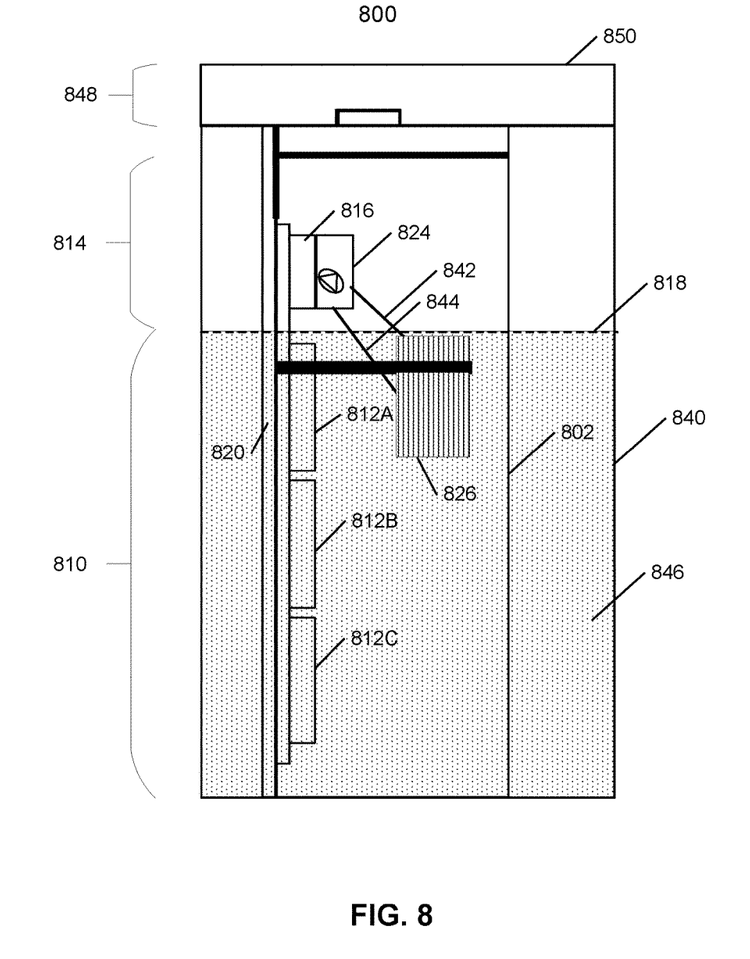
FIG. 8 is a block diagram illustrating an example of a server chassis for immersion cooling deployed as an immersion cooling system in a data center system according to one embodiment.

FIG. 8 is a block diagram illustrating an example of a server chassis for immersion cooling deployed as an immersion cooling system 800 according to one embodiment. The immersion cooling system 800 can be installed as a part of a data center system. FIG. 8 illustrates a hybrid solution provided by immersion cooling system 800 with a portion of a container 840 having two-phase coolant 846 therein providing an indirect immersion cooling for a second set of electronic components 816 and a direct immersion cooling for a first set of electronic components 812A-812C. The container is partitioned into a plurality of server slots.

As illustrated, the immersion cooling system 800 further includes a server chassis for immersion cooling having a chassis frame 802 with a chassis base and an adjustable server panel coupled to the chassis base to receive a server blade to be mounted on the adjustable server panel. Although a single server chassis is shown in FIG. 8, the immersion cooling system 800 can also include a plurality of server chassis corresponding to the plurality of server. The server blade includes a first portion and a second portion. The first portion has a first set of electronic components and the second portion has a second set of electronic components. The adjustable server panel is adjustably mounted along the chassis base, such that when the at least server chassis is deposited into the container, the first set of electronic components 812A-812C is at least partially submerged into a liquid region 810 filled with the two-phase coolant 846, and the second set of electronic components 816 is positioned within a vapor region 814 above an immersion line 818 defining the liquid region 810 and the vapor region 814.

The container 840 can also include an air region 848. In one embodiment, the container 840 may include a lid 850 positioned at the top of the container 840.

As shown, the server blade 820 is installed in a container 840 in an upright or vertical position. The first portion of the server blade is submerged within a liquid region 810 of the container 840 allowing the first set of electronic components 812A-812C to be cooled using a direct immersion cooling. The second portion of the server blade is positioned within the vapor region 814 of the container 840 providing an indirect immersion cooling to the second set of the electronic components 816. The direct and indirect immersion cooling provides a hybrid solution as described herein. The immersion line 818 separates the liquid region 810 and the vapor region 814. The liquid region 810 is defined below the immersion line 818 and is filled with two-phase coolant 846.

In one embodiment, the server chassis further includes a heat extractor 824 to be attached to at least one of the electronic components of the second set in the second portion of the server blade 820 such that the heat extractor 824 is positioned within the vapor region 814 and above the immersion line 818 when the server blade 820 is positioned in an upright position within the container 840. The heat extractor 824 is configured to extract heat from the second portion of the server blade 820.

The server chassis additionally includes a remote cooler 826 to be positioned in a predefined location in the first portion of the server blade 820 such that the remote cooler 826 is submerged within the two-phase coolant 846. The remote cooler 826 is thermally coupled to the heat extractor 824 to receive the heat from the heat extractor 824 and extract the received heat into the two-phase coolant 846.

In this embodiment, the remote cooler 826 is positioned below the heat extractor 824 when the server blade 820 is positioned upright or vertical as shown in FIG. 8.

In one embodiment, the heat extractor 824 can be a liquid based cooling plate that is configured to extract heat generated by the second set of electronic components 816. In an embodiment, the heat extractor 824 is a single phase liquid cooing cold plate. In an embodiment, the heat extractor 824 is a two-phase cooling plate that is configured to extract heat from the second set of the electronic components 816. As described herein, the heat extractor 824 is coupled to an external cooling source, such as a remote cooler 826, via a supply line 842 and a return line 844 to form a heat exchanging recirculation loop. For this heat exchanging recirculation loop, the remote cooler 826 is a condenser for the two-phase fluid flowing within the supply line 842 and the return line 844. If the cooling plate is a single phase one, the remote cooler 826 functions to exchange heat from the internal fluid within the loop formed by the supply line 842 and the return line 844 to the two phase immersion cooling fluid.

As previously explained, an embodiment of the disclosure may be (or include) a non-transitory machine-readable medium (such as microelectronic memory) having stored thereon instructions, which program one or more data processing components (generically referred to here as a "processor") to perform cooling operations. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A server chassis for immersion cooling, comprising:
   a chassis frame having a chassis base and an adjustable server panel coupled to the chassis base to receive a server blade to be mounted on the adjustable server panel,
   wherein the server blade includes a first portion and a second portion, the first portion having a first set of electronic components and the second portion having a second set of electronic components,
   wherein the adjustable server panel is adjustably mounted along the chassis base, such that when the server chassis is deposited into a container having two-phase coolant therein, the first set of electronic components is at least partially submerged into a liquid region filled with the two-phase coolant, and the second set of electronic components is positioned within a vapor region above an immersion line defining the liquid region and the vapor region.

2. The server chassis of claim 1, wherein the adjustable server panel is adjustable along the chassis base based on the immersion line.

3. The server chassis of claim 1, further comprising:
   a heat extractor to be attached to at least one of the electronic components of the second set in the second portion of the server blade such that the heat extractor is positioned within the vapor region and above the immersion line when the server blade is positioned in an upright position within the container, the heat extractor being configured to extract heat from the second portion of the server blade; and
   a remote cooler to be positioned in a predefined location in the first portion of the server blade such that the remote cooler is submerged within the two-phase coolant, the remote cooler being thermally coupled to the heat extractor to receive the heat from the heat extractor and extract the received heat into the two-phase coolant.

4. The server chassis of claim 3, wherein the remote cooler is elevated from the chassis base of the chassis frame using an elevation frame, thereby providing an additional space for the server blade to mount additional electronic components.

5. The server chassis of claim 4, wherein the elevation frame is coupled to the chassis base of the chassis frame and positioned near one of two sides of the chassis frame, and wherein the two sides of the chassis frame are perforated with openings to maximize a flow of the two-phase coolant through the openings.

6. The server chassis of claim 4, wherein the elevation frame is slidably coupled to a base frame, wherein the base frame is to be positioned on a predefined location on the chassis base of the chassis frame, and wherein the predefined location on the chassis base of the chassis frame is adjustable.

7. The server chassis of claim 3, wherein the heat extractor comprises a fluid recirculating pump configured to transfer the heat extracted by the heat extractor from the second set of electronic components into the remote cooler.

8. The server chassis of claim 3, wherein the second set of electronic components comprises one or more peripheral component interconnect express (PCIE) devices attached to one or more heat extractors.

9. The server chassis of claim 3, wherein the remote cooler is thermally coupled to the heat extractor via one or more copper plates, thereby allowing a heat transfer from the heat extractor to the remote cooler.

10. An immersion cooling system, comprising:
a container having two-phase coolant contained therein, the container being partitioned into a plurality of server slots; and
a plurality of server chassis corresponding to the plurality of server slots, each of the server chassis comprising:
a chassis frame having a chassis base and an adjustable server panel coupled to the chassis base to receive a server blade to be mounted on the adjustable server panel,
wherein the server blade includes a first portion and a second portion, the first portion having a first set of electronic components and the second portion having a second set of electronic components,
wherein the adjustable server panel is adjustably mounted along the chassis base, such that when the server chassis is deposited into the container having the two-phase coolant therein, the first set of electronic components is at least partially submerged into a liquid region filled with the two-phase coolant, and the second set of electronic components is positioned within a vapor region above an immersion line defining the liquid region and the vapor region.

11. The immersion cooling system of claim 10, wherein the adjustable server panel is adjusted along the chassis base to adjust a position of the server blade with respective to the immersion line.

12. The immersion cooling system of claim 10, wherein each server chassis further comprises:
a heat extractor to be attached to at least one of the electronic components of the second set in the second portion of the server blade such that the heat extractor is positioned within the vapor region and above the immersion line when the server blade is positioned in an upright position within the container, the heat extractor being configured to extract heat from the second portion of the server blade; and
a remote cooler to be positioned in a predefined location in the first portion of the server blade such that the remote cooler is submerged within the two-phase coolant, the remote cooler being thermally coupled to the heat extractor to receive the heat from the heat extractor and extract the received heat into the two-phase coolant.

13. The immersion cooling system of claim 12, wherein the remote cooler is elevated from the chassis base of the chassis frame using an elevation frame, thereby providing additional space for the server blade having high density electronic components.

14. The immersion cooling system of claim 13, wherein the elevation frame is coupled to the chassis base of the chassis frame and positioned near one of two sides of the chassis frame, and wherein the two sides of the chassis frame are perforated with openings to maximize a flow of the two-phase coolant through the openings.

15. The immersion cooling system of claim 13, wherein the elevation frame is slidably coupled to a base frame, wherein the base frame is to be positioned on a predefined location on the chassis base of the chassis frame, and wherein the predefined location on the chassis base of the chassis frame is adjustable.

16. The immersion cooling system of claim 12, wherein the heat extractor comprises a fluid recirculating pump configured to transfer the heat extracted by the heat extractor from the second set of electronic components into the remote cooler.

17. The immersion cooling system of claim 12, wherein the second set of electronic components comprises one or more peripheral component interconnect express (PCIE) devices equipped with one or more heat extractors.

18. The immersion cooling system of claim 12, wherein the remote cooler is thermally coupled to the heat extractor via one or more copper plates, thereby allowing a heat transfer from the heat extractor to the remote cooler.

19. A data center system, comprising:
a plurality of containers, each having two-phase coolant contained therein, wherein each of the containers is partitioned into a plurality of server slots to receive a plurality of server chassis respectively,
wherein each server chassis comprises:
a chassis frame having a chassis base and an adjustable server panel coupled to the chassis base to receive a server blade to be mounted on the adjustable server panel,
wherein the server blade includes a first portion and a second portion, the first portion having a first set of electronic components and the second portion having a second set of electronic components,
wherein the adjustable server panel is adjustably mounted along the chassis base, such that when the server chassis is deposited into a corresponding container, the first set of electronic components is at least partially submerged into a liquid region filled with the two-phase coolant, and the second set of electronic components is positioned within a vapor region above an immersion line defining the liquid region and the vapor region.

20. The data center system of claim 19, wherein each server chassis further comprises:
a heat extractor to be attached to at least one of the electronic components of the second set in the second portion of the server blade such that the heat extractor is positioned within the vapor region and above the immersion line when the server blade is positioned in an upright position within the container to extract heat from the second portion of the server blade; and a remote cooler to be positioned in a predefined location in the first portion of the server blade such that the remote cooler is submerged within the two-phase coolant, the remote cooler being thermally coupled to the heat extractor to receive the heat from the heat extractor and extract the received heat into the two-phase coolant.

\* \* \* \* \*